United States Patent
Lin et al.

(10) Patent No.: US 12,364,054 B2
(45) Date of Patent: Jul. 15, 2025

(54) BACK-CONTACT BATTERY AND MANUFACTURING METHOD THEREOF, AND PHOTOVOLTAIC MODULE

(71) Applicant: GOLD STONE (FUJIAN) ENERGY COMPANY LIMITED, Fujian (CN)

(72) Inventors: Kairui Lin, Fujian (CN); Chaohua Zhang, Fujian (CN)

(73) Assignee: GOLD STONE (FUJIAN) ENERGY COMPANY LIMITED, Quanzhou (CN)

( * ) Notice: Subject to any disclaimer, the term of this patent is extended or adjusted under 35 U.S.C. 154(b) by 0 days.

(21) Appl. No.: 18/880,266

(22) PCT Filed: Mar. 19, 2024

(86) PCT No.: PCT/CN2024/082388
§ 371 (c)(1),
(2) Date: Dec. 30, 2024

(87) PCT Pub. No.: WO2024/199002
PCT Pub. Date: Oct. 3, 2024

(65) Prior Publication Data
US 2025/0169224 A1    May 22, 2025

(30) Foreign Application Priority Data
Mar. 31, 2023   (CN) .......................... 202310332231.1

(51) Int. Cl.
*H10F 77/30*     (2025.01)
*H10F 10/166*    (2025.01)
(Continued)

(52) U.S. Cl.
CPC ......... *H10F 77/315* (2025.01); *H10F 10/166* (2025.01); *H10F 71/103* (2025.01);
(Continued)

(58) Field of Classification Search
CPC .... H10F 77/219; H10F 77/223; H10F 77/227; H10F 77/315; H10F 77/1662;
(Continued)

(56) References Cited

U.S. PATENT DOCUMENTS 7,964,431 B2 * 6/2011 Petti ................. H10F 10/14
                                                    438/785
2005/0172996 A1 * 8/2005 Hacke ................ H10F 77/227
                                                    438/98
(Continued)

FOREIGN PATENT DOCUMENTS

CN        102623517 A  *  8/2012  ..... H01L 31/022441
CN        106062972 A     10/2016
(Continued)

OTHER PUBLICATIONS

CN 102623517 A English Translation by FIT database, translated on May 17, 2025.*

(Continued)

*Primary Examiner* — Golam Mowla

(57) ABSTRACT

Provided are a back-contact battery and a manufacturing method thereof, and a photovoltaic module, which includes a silicon substrate with a front surface and a back surface; a first semiconductor layer with a second semiconductor opening region arranged back surface; and a second semiconductor layer. The back-contact battery further includes multiple insulating layers arranged at intervals along an X-axis direction of the back surface, wherein the insulating layers are arranged on the outer surface of the second semiconductor layer. In the X-axis direction, the insulating layer spans a side-surface edge of the second semiconductor opening region with both ends extending, respectively; the insulating layer has a span length W12 on the second semiconductor opening region, and the insulating layer has (Continued)

a span length W11 on the first semiconductor layer, satisfying a condition: W12:W11=0.1-10:1.

15 Claims, 4 Drawing Sheets

(51) Int. Cl.
  *H10F 71/00* (2025.01)
  *H10F 71/10* (2025.01)
  *H10F 77/166* (2025.01)
  *H10F 77/20* (2025.01)
(52) U.S. Cl.
  CPC ......... *H10F 71/129* (2025.01); *H10F 71/134* (2025.01); *H10F 77/1662* (2025.01); *H10F 77/219* (2025.01)
(58) Field of Classification Search
  CPC .... H10F 71/103; H10F 71/129; H10F 71/134; H10F 10/166; H10F 19/908
  See application file for complete search history.

(56) References Cited

U.S. PATENT DOCUMENTS

| | | | | |
|---|---|---|---|---|
| 2010/0218821 | A1* | 9/2010 | Kim | H10F 10/146 136/256 |
| 2012/0111399 | A1* | 5/2012 | Kondo | H10F 10/146 257/E31.124 |
| 2014/0020753 | A1* | 1/2014 | Goto | H10F 77/219 438/96 |
| 2018/0033898 | A1 | 2/2018 | Shigematsu et al. | |
| 2020/0098939 | A1 | 3/2020 | Nakai et al. | |

FOREIGN PATENT DOCUMENTS

| | | | | |
|---|---|---|---|---|
| CN | 108140680 | A | | 6/2018 |
| CN | 110690308 | A | | 1/2020 |
| CN | 110896118 | A | | 3/2020 |
| CN | 115312633 | A | | 11/2022 |
| CN | 115588698 | A | | 1/2023 |
| CN | 115763609 | A | | 3/2023 |
| CN | 115832065 | A | | 3/2023 |
| CN | 116053331 | A | | 5/2023 |
| CN | 117174776 | A | | 12/2023 |
| JP | 2011181606 | A * | 9/2011 | ..... H01L 31/022441 |
| JP | 2014220291 | A | | 11/2014 |
| WO | 2018168180 | A1 | | 9/2018 |

OTHER PUBLICATIONS

First office action of counterpart Chinese Patent Application No. 202310332231.1 issued on May 7, 2023.
Notice of Allowance of counterpart Chinese Patent Application No. 202310332231.1 issued on May 15, 2023.
International Search Report of PCT Patent Application No. PCT/CN2024/082388 issued on May 14, 2024.
Written Opinion of the International Searching Authority of PCT Patent Application No. PCT/CN2024/082388 issued on May 14, 2024.

* cited by examiner

BACK-CONTACT BATTERY AND MANUFACTURING METHOD THEREOF, AND PHOTOVOLTAIC MODULE

CROSS-REFERENCE TO RELATED APPLICATION

The present disclosure claims the priority to the Chinese patent application with the filling No. 2023103322311 filed with the Chinese Patent Office on Mar. 31, 2023, and entitled "BACK-CONTACT BATTERY AND MANUFACTURING METHOD THEREOF, AND PHOTOVOLTAIC MODULE", the contents of which are incorporated herein by reference in entirety.

TECHNICAL FIELD

The present disclosure belongs to the technical field of back-contact batteries, and particularly to a back-contact battery and a manufacturing method thereof, and a photovoltaic module.

BACKGROUND ART

Currently, existing back-contact batteries are provided with conventional heterojunction passivation structures or combined passivation structures. In the combined passivation structure, the first passivation layer of the first semiconductor layer uses a tunneling oxide layer for passivation, and the second passivation layer of the second semiconductor layer uses an intrinsic silicon layer for passivation. Compared to conventional heterojunction passivation, this provides better battery performance. In existing back-contact batteries, a second semiconductor opening region is provided on a first semiconductor layer to accommodate a portion of a second semiconductor layer, and the second semiconductor layer is provided with a first semiconductor opening region to expose a portion of the first semiconductor layer, which is respectively configured to form two emitters in conjunction with a metal electrode.

However, the side-surface edges of the second semiconductor opening region, which is the contact interface between the first semiconductor layer and the second semiconductor layer in the Z-axis direction, are prone to current leakage and short circuit which are serious. This reduces the parallel resistance of the battery which in turn reduces the efficiency of the battery and the yield of the battery.

CN115588698A provides a back-contact solar battery and a preparation method thereof, and a photovoltaic module, wherein the back-contact solar battery includes: a silicon substrate; and a first semiconductor layer, a second semiconductor layer, and a first insulating layer located on a first surface of the silicon substrate. A first portion of the second semiconductor layer is provided alternately with the first semiconductor layer and is provided with a gap therebetween. A second portion of the second semiconductor layer is continuous with the first portion and extends on a side of the first semiconductor layer away from the silicon substrate along a second direction perpendicular to the first surface. The first insulating layer is arranged at least in the gap, and the first insulating layer is proximate to an end portion of the first conductive semiconductor layer. Between the first conductive semiconductor layer and the second conductive semiconductor layer, in addition to providing a second intrinsic semiconductor layer to play a passivation and insulating role, the first insulating layer provides a good insulating enhancing effect to the first conductive semiconductor layer and the second conductive semiconductor layer, thus reducing the probability of leakage between different types of conductive semiconductor layers. Under the condition of providing the mask layer, in this patent application, the first insulating layer is arranged between the first semiconductor layer and the second semiconductor layer. The first insulating layer directly contacts the silicon substrate over a certain width, which needs to simultaneously account for passivation effects, thus impacting the battery efficiency and the battery yield. Additionally, the preparation process is complex.

Therefore, there is an urgent need in the field for a back-contact battery that can effectively prevent leakage phenomena at the side-surface edge of the second semiconductor opening region, which has excellent battery efficiency and battery yield and is easy to prepare.

SUMMARY

The objective of the present disclosure is to overcome the defects in the prior art, and the defects lie in that it is impossible to simultaneously achieve the effective avoidance of leakage at the side-surface edge of the second semiconductor opening region, the excellent battery efficiency and the battery yield, and the simplicity of the preparation process. A back-contact battery and a manufacturing method thereof, and a photovoltaic module are provided. The back-contact battery can simultaneously achieve the effective avoidance of leakage at the side-surface edge of the second semiconductor opening region, the excellent battery efficiency and the battery yield, and the simplicity of the preparation process.

To achieve the above objective, in a first aspect, the present disclosure provides a back-contact battery, which includes a silicon substrate with a front surface and a back surface; a first semiconductor layer with a second semiconductor opening region arranged on the back surface; and a second semiconductor layer arranged on an outer surface of the first semiconductor layer and within the second semiconductor opening region. The back-contact battery also includes multiple insulating layers arranged at intervals along the X-axis direction of the back surface, wherein the insulating layers are arranged on the outer surface of the second semiconductor layer. In the X-axis direction, the insulating layer spans the side-surface edge of the second semiconductor opening region with both ends extending, respectively. The insulating layer has a span length $W12$ on the second semiconductor opening region, and the insulating layer has a span length $W11$ on the first semiconductor layer, satisfying a condition: $W12:W11=0.1-10:1$.

In some optional embodiments, a length $W1$ of the insulating layer in the X-axis direction is 20-200 μm and $W12 \geq 10$ μm.

In some optional embodiments, a material of the insulating layer includes at least one of silicon nitride, silicon oxynitride, and silicon oxide.

In some optional embodiments, the back-contact battery further includes a conductive film layer, which is arranged on the outer surface of the insulating layer and is thereon arranged with an isolation trench. The isolation trench is located on the outer surface of the insulating layer in the Z-axis direction.

In some optional embodiments, a width $W3$ of the isolation trench in the X-axis direction is 10-190 μm.

In some optional embodiments, a ratio of a length $W1$ of the insulating layer in the X-axis direction to the width $W3$ of the isolation trench is 0.3-10:1.

In some optional embodiments, the isolation trench is located directly above the side-surface edge of the second semiconductor opening region.

In some optional embodiments, the back-contact battery further includes an insulating protective layer covering an outer surface of the insulating layer, wherein the insulating protective layer is located between the insulating layer and the conductive film layer, and the isolation trench is located on the outer surface of the insulating protective layer in the Z-axis direction.

In some optional embodiments, a thickness of the insulating protective layer is 5-30 μm.

In some optional embodiments, a material of the insulating protective layer includes at least one of epoxy resin, acrylic resin, and polyurethane resin.

In some optional embodiments, the first semiconductor layer includes a first passivation layer and a first conductive semiconductor film layer, wherein the first passivation layer is a tunneling oxide layer or an intrinsic silicon layer. The second semiconductor layer includes a second passivation layer and a second conductive semiconductor film layer, wherein the second passivation layer is an intrinsic silicon layer. One of the first conductive semiconductor film layer and the second conductive semiconductor film layer is N-type, optionally N-type doped polysilicon layer; and the other is P-type, optionally P-type doped amorphous silicon or microcrystalline silicon layer.

More optionally, the first passivation layer is a tunneling oxide layer, the first conductive semiconductor film layer is a doped polysilicon layer, and the second conductive semiconductor film layer is a doped amorphous silicon or microcrystalline silicon layer.

More optionally, the first conductive semiconductor film layer is N-type, and the second conductive semiconductor film layer is P-type.

In some optional embodiments, a mask layer is not provided between the first semiconductor layer and the second semiconductor layer.

In some optional embodiments, the front surface of the silicon substrate is a textured surface, and the back surface of the silicon substrate is a polished surface; or, the second semiconductor opening region of the back surface is a textured surface and the other regions of the back surface are polished regions.

In some optional embodiments, the second semiconductor layer is provided with first semiconductor opening regions arranged at intervals along the X-axis direction to expose the first semiconductor layer. The first semiconductor opening regions are located between two adjacent second semiconductor opening regions, and the first semiconductor opening regions accommodate a portion of the conductive film layer.

More optionally, in the X-axis direction, the length W4 of the first semiconductor opening region is 100-300 μm, the length W2 of the second semiconductor opening region is 300-700 μm, and the spacing Wg between the first semiconductor opening region and the second semiconductor opening region is 50-400 μm.

More optionally, W12/W2 is 1:3-55, and W11/Wg is 1:1-10.

In some optional embodiments, the back-contact battery further includes
 metal electrodes, respectively arranged on the outer surface of the first semiconductor opening region and the outer surface of the second semiconductor opening region;
 a front passivation layer, arranged on the front surface of the silicon substrate; and
 a front anti-reflection layer, arranged on the outer surface of the front passivation layer.

More optionally, the front passivation layer is a silicon dielectric passivation layer, and the front anti-reflection layer is a silicon dielectric anti-reflection layer.

In a second aspect, the present disclosure provides a preparation method of a back-contact battery, wherein the back-contact battery is the back-contact battery described in the first aspect. The preparation method of a back-contact battery includes the following steps:

S101: providing a silicon substrate with a first semiconductor layer, a second semiconductor layer, and an insulating film sequentially arranged along the Z-axis direction on the back surface, wherein the first semiconductor layer is provided with second semiconductor opening regions arranged at intervals to accommodate a portion of the second semiconductor layer;

S102: applying, on the back surface obtained from S101, protective ink on a portion of the outer surface of the insulating film. The protective ink covers the outer surface of the portion of the insulating film that needs to be retained, and the size of the protective ink is set according to the insulating layer required to be formed; and S103: removing, on the back surface obtained from S102, the portion of the insulating film not covered by the protective ink, thereby forming the insulating layer from the portion of the insulating film that needs to be retained.

In some optional embodiments, S103 further includes: after removing the portions of the insulating film not covered by the protective ink, further removing the protective ink.

In other optional embodiments, in S102, the protective ink serves as an insulating protective layer, and in S103, the protective ink is not removed.

In some optional embodiments, the preparation method also includes the following steps:

S104: depositing a conductive film layer on the back surface obtained from S103; and S105: opening an isolation trench on the conductive film layer of the back surface obtained in S104.

More optionally, the method for opening the isolation trench can be laser etching, printing, or etching after inkjet printing of the protective ink.

In some optional embodiments, S101 further includes forming a front passivation layer and a front anti-reflection layer on the front surface of the silicon substrate and forming the first semiconductor opening region on the second semiconductor layer.

More optionally, the preparation method further includes: S106, arranging metal electrodes respectively on the outer surface of the first semiconductor opening region and the outer surface of the second semiconductor opening region on the back surface obtained from S105.

In a third aspect, the present disclosure provides a photovoltaic module, including the back-contact battery described in the first aspect.

The beneficial effects are as follows.

In the present disclosure, by arranging the insulating layer on the outer surface of the second semiconductor layer and ensuring that in the X-axis direction, the insulating layer spans the side-surface edge of the second semiconductor opening region and extends at both ends in the aforementioned suitable proportions, it can significantly improve leakage phenomena and avoid short circuits without the need for arranging a mask layer. This increases the parallel resistance of the battery, thereby improving the conversion efficiency of the battery and the battery yield. Compared to the first insulating layer of CN115588698A, which is arranged within the gaps of the side-surface edge of the second semiconductor opening region and directly contacts the silicon substrate with certain width, the insulating layer of the present disclosure is entirely arranged on the outer surface of the second semiconductor layer and spans with suitable proportional length. It is independent of the two semiconductor layers, without doping or crossing, and does not weaken the passivation effect of the two semiconductor layers. There is no need to consider passivation or balance the effects of passivation and insulation. The insulation effect is better. Since a mask layer may not be arranged, the passivation effect is enhanced. Additionally, the preparation process is simplified.

Optionally, in the patent application of prior research of applicant of the present disclosure, which is titled "BACK-CONTACT BATTERY WITH SPECIFIC ISOLATION TRENCH ARRANGEMENT AND PREPARATION METHOD THEREOF", the isolation trench is located above the contact interface in the Z-axis direction between the first semiconductor layer and the second semiconductor layer and spans the textured surface and the polished surface. There is no mask layer between the isolation trench and the second semiconductor layer for protection. If laser etching is used on the textured surface, it will severely damage the underlying second semiconductor layer. Therefore, only the mask etching method can ensure the reliability of the battery. Thus, in the optional solution of the present disclosure, the isolation trench is located on the outer surface of the insulating layer in the Z-axis direction. The insulating layer (or the insulating layer and the insulating protective layer) can serve as the mask layer for preparing the isolation trench. The isolation trench can be entirely on the polished region or the outer surface of the insulating protective layer, thus realizing openings on the polished region or on the insulating protective layer. The laser isolation method can be used without damaging the second semiconductor layer, simplifying the process and improving the reliability of the battery. Moreover, the insulating layer of the present disclosure can optionally be made of at least one of silicon nitride, silicon oxynitride, or silicon oxide. Compared to the prior research patent application of the present disclosure applicant, in which the printed or sprayed insulating layer of the isolation trench is a polymer material, the water resistance is significantly improved, thus enhancing the reliability of the battery.

BRIEF DESCRIPTION OF DRAWINGS

In order to more clearly illustrate the technical solutions of the embodiments of the present disclosure, the following will briefly introduce the drawings used in the embodiments. It should be understood that the following drawings only show some embodiments of the present disclosure, and therefore it should not be regarded as a limitation on the scope. Those ordinary skilled in the art can also obtain other related drawings based on these drawings without inventive effort.

REFERENCE NUMERALS

Figure 1:
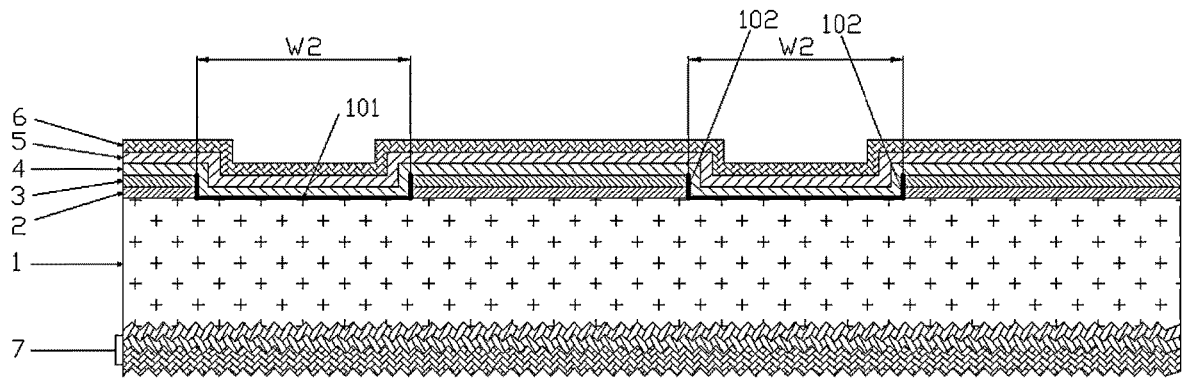
FIG. 1 is a schematic diagram of a structure of a battery formed with a front film layer, and formed with a first semiconductor layer, a second semiconductor layer, and an insulating film on a back surface in Example 1 of the present disclosure.

1—silicon substrate; 2—first passivation layer; 3—first conductive semiconductor film layer; 4—second passivation layer; 5—second conductive semiconductor film layer; 6—insulating film; 7—front film layer; 8—protective ink; 9—conductive film layer; 10—metal electrode; 11—mask layer; 101—horizontal region of the second semiconductor opening region; 102—side-surface edge of the second semiconductor opening region.

DETAILED DESCRIPTION OF EMBODIMENTS

In the description of the present disclosure, a direction close to the silicon substrate is internal and a direction away from the silicon substrate is external. The terms "first" and "second" are configured for describing the objectives only and should not be understood as indicating or implying relative importance, or specifying the quantity of the indicated technical features. Consequently, features labeled with "first" or "second" can explicitly or implicitly include one or more of those features. In the description of the present disclosure, the term "multiple" means two or more, unless otherwise explicitly specified.

In the present disclosure, unless otherwise expressly provided and limited, the first feature "on" or "under" the second feature may be a direct contact between the first and second features, or an indirect contact between the first and second features through an intermediate medium. Furthermore, the first feature being "above", "over" and "on top of" the second feature can mean that the first feature is directly above or diagonally above the second feature, or simply that the first feature is horizontally higher than the second feature. The first feature being "under", "below" and "beneath" the second feature can mean that the first feature is directly below or diagonally below the second feature, or it can simply mean that the horizontal height of the first feature is less than that of the second feature.

The endpoints of the range disclosed in the present disclosure and any values are not limited to the precise range or value; these ranges or values should be understood to include values close to these ranges or values. For numerical ranges, the values between the endpoints of different ranges, between the endpoints of different ranges and individual points, and between individual points themselves can be combined to form one or more new numerical ranges, where the numerical ranges should be considered as specifically disclosed herein. The terms "alternative" and "optional" both mean that it can be comprised or may not be comprised (or can exist or may not exist).

In a first aspect, the present disclosure provides a back-contact battery, which includes a silicon substrate with a front surface and a back surface; a first semiconductor layer with a second semiconductor opening region arranged on the back surface; and a second semiconductor layer arranged on an outer surface of the first semiconductor layer and within the second semiconductor opening region. The back-contact battery also includes multiple insulating layers arranged at intervals along the X-axis direction of the back surface, wherein the insulating layers are arranged on the outer surface of the second semiconductor layer. In the X-axis direction, the insulating layer spans the side-surface edge of the second semiconductor opening region with both ends extending, respectively. The insulating layer has a span length W12 on the second semiconductor opening region, and the insulating layer has a span length W11 on the first semiconductor layer, satisfying a condition: W12:W11=0.1-10:1. Specifically, it can be, for example, 0.1:1, 0.5:1, 1:1, 2:1, 3:1, 4:1, 5:1, 6:1, 7:1, 8:1, 9:1, 10:1, and optionally 1-5:1.

In the back-contact battery of the present disclosure, by providing an insulating layer having a specific span length ratio as described above, it can significantly improve leakage phenomena and avoid short circuits without the need for arranging a mask layer. This increases the parallel resistance of the battery, thereby improving the conversion efficiency of the battery and the battery yield. Under the same conditions, if W12:W11 is too large or too small, the insulation effect will be poor due to the fact that the edge of the insulating layer is too close to the side-surface edge of the second semiconductor opening region, thereby affecting the battery yield and the conversion efficiency of the battery.

In some optional embodiments, a length W1 of the insulating layer in the X-axis direction is 20-200 μm.

More optionally, W12≥10 μm. By this optional solution, the width of the insulating layer coverage can extend beyond the side-surface edge of the second semiconductor opening region by more than 10 μm, which can significantly improve leakage phenomena and avoid short circuits, thereby increasing the parallel resistance of the battery and the conversion efficiency of the battery.

In some optional embodiments, a material of the insulating layer includes at least one of silicon nitride, silicon oxynitride, and silicon oxide. With this optional solution, the insulating layer has better water resistance, which is more conducive to improving the reliability of the battery, the battery yield, and the conversion efficiency.

In some optional embodiments, the back-contact battery further includes a conductive film layer, which is arranged on the outer surface of the insulating layer and is thereon arranged with an isolation trench. The isolation trench is located on the outer surface of the insulating layer in the Z-axis direction.

In some optional embodiments, a width W3 of the isolation trench in the X-axis direction is 10-190 μm, optionally 50-190 μm. The isolation trench in the present disclosure mainly functions to insulate the conductive film layers on the surfaces of the first semiconductor layer and the second semiconductor layer. Within an appropriate W3 range, it is more conducive to maximizing the avoidance of short circuits to improve the battery yield while simultaneously enhancing the transport length of carrier on the conductive film layer to improve the battery efficiency.

Those skilled in the art can select the thickness of the insulating layer based on actual requirements. For example, the thickness of the insulating layer can be 30-100 nm.

In some optional embodiments, a ratio of a length W1 of the insulating layer in the X-axis direction to the width W3 of the isolation trench is 0.3-10:1.

Further optionally, a ratio of a length W1 of the insulating layer in the X-axis direction to the width W3 of the isolation trench is 1.1-10:1, more optionally 1.1-6:1. In the optional solution, the width of W1 is greater than the width of the isolation trench, so that the isolation trench does not exceed the W1 region. This can allow the isolation trench W3 to be completely formed on the surface of the insulating layer, and thus, the insulating layer provides protection under the isolation trench. This enhances the reliability of the battery and prevents the phenomenon where the semiconductor layer is unprotected by the mask layer after forming the isolation trench.

The isolation trench described in the present disclosure only needs to satisfy the condition of not exceeding the W1 region. In some optional embodiments, the isolation trench is located directly above the side-surface edge of the second semiconductor opening region, which is more conducive to improving the reliability of the battery.

In some optional embodiments, the back-contact battery further includes an insulating protective layer covering an outer surface of the insulating layer, wherein the insulating protective layer is located between the insulating layer and the conductive film layer, and the isolation trench is located on the outer surface of the insulating protective layer in the Z-axis direction.

Optionally, in the present disclosure, a thickness of the insulating protective layer is 5-30 μm.

In some optional embodiments, a material of the insulating protective layer includes at least one of epoxy resin, acrylic resin, and polyurethane resin, which cannot be removed by washing with hot water or acid/alkali solutions.

The types of conductive film layers described in the present disclosure can include, for example, a transparent conductive film layer or a composite layer of a transparent conductive film and a metal film. The transparent conductive film layer can be an indium oxide-based film doped with tin, zinc, tungsten, titanium, etc. The metal film can be a thin film of one or more of gold, silver, copper, aluminum, nickel, or nickel alloys. Those skilled in the art can select according to their needs.

The first semiconductor layer includes a first passivation layer and a first conductive semiconductor film layer, wherein the first passivation layer is a tunneling oxide layer or an intrinsic silicon layer. The second semiconductor layer includes a second passivation layer and a second conductive semiconductor film layer, wherein the second passivation layer is an intrinsic silicon layer. For the first conductive semiconductor film layer and the second conductive semiconductor film layer, one is N-type, and the other is P-type.

The first passivation layer is an intrinsic silicon layer, for example, it can be intrinsic amorphous silicon. In this case, the back-contact battery of the present disclosure is a conventional heterojunction battery. The first conductive semiconductor film layer and the second conductive semiconductor film layer can each be a doped amorphous silicon or microcrystalline silicon layer. In some specific embodiments of the conventional heterojunction battery structure, the thickness of the intrinsic silicon layer can be, for example, 5-10 nm. The thickness of the first conductive semiconductor film layer can be 10-15 nm, with a doping concentration of 8 e18-8 e20 cm$^{-3}$. The thickness of the second passivation layer can be 5-15 nm, and the thickness of the second conductive semiconductor film layer can be 5-25 nm, with a doping concentration of 8 e18-8 e20 cm$^{-3}$.

More optionally, the first passivation layer is a tunneling oxide layer, the first conductive semiconductor film layer is a doped polysilicon layer, and the second conductive semiconductor film layer is a doped amorphous silicon or microcrystalline silicon layer.

Those skilled in the art can select the thickness of the first passivation layer, the first conductive semiconductor film layer, the second conductive semiconductor film layer, and the second passivation layer, and the doping concentration of the first conductive semiconductor film layer and the second conductive semiconductor film layer based on actual needs. For example, the corresponding layer thicknesses and doping concentrations or other conventional ranges disclosed in earlier patents of the applicants of the present disclosure can be adopted. In some specific embodiments of the combined passivation back-contact battery, the thickness of the first passivation layer is 0.5-5 nm, the doping concentration of the first conductive semiconductor film layer is 8 e18-8 e20 cm$^{-3}$ with a thickness of 100-200 nm, the thickness of the second passivation layer is 5-15 nm, and the thickness of the second conductive semiconductor film layer is 5-25 nm with a doping concentration of 8 e18-8 e20 cm$^{-3}$.

More optionally, the first conductive semiconductor film layer is N-type, and the second conductive semiconductor film layer is P-type. In this optional solution, the bottom of the spacing Wg between the first semiconductor opening region and the second semiconductor opening region is an N-type semiconductor. Because N-type semiconductors have better passivation effects and conductivity compared to P-type semiconductors, this can enhance the passivation effect of the battery and reduce the electrical loss during carrier transport, which is more conducive to improving the conversion efficiency of the battery.

In some optional embodiments, a mask layer is not provided between the first semiconductor layer and the second semiconductor layer.

In the present disclosure, those skilled in the art can choose the front surface and the back surface of the silicon substrate to be a polished or textured structure, respectively, based on the light reflection conditions of the front surface or the back surface and their impact on conversion efficiency or the preparation process. In some optional embodiments, the front surface of the silicon substrate is a textured surface. The back surface of the silicon substrate is a polished surface; or, the second semiconductor opening region of the back surface is a textured surface and the other regions of the back surface are polished regions. It is more conducive to significantly reducing the reflection of light and increasing the conversion efficiency of the battery at the same time.

In some optional embodiments, the second semiconductor layer is provided with first semiconductor opening regions arranged at intervals along the X-axis direction to expose the first semiconductor layer. The first semiconductor opening regions are located between two adjacent second semiconductor opening regions, and the first semiconductor opening regions accommodate a portion of the conductive film layer.

More optionally, in the X-axis direction, the length W4 of the first semiconductor opening region is 100-300 μm, the length W2 of the second semiconductor opening region is 300-700 μm, and the spacing Wg between the first semiconductor opening region and the second semiconductor opening region is 50-400 μm.

More optionally, W12/W2 is 1:3-55, and W11/Wg is 1:1-10.

More optionally, W12/W2 is 1:3-35, more optionally 1:9-25; and W11/Wg is 1:1-10, more optionally 1:1-5. In this optional solution, the region covered by the insulating layer, on the one hand, can extend beyond the side-surface edge of the second semiconductor opening region by an appropriate safety distance, which is conducive to increasing the transport distance of the carrier on the conductive film layer and appropriately reducing the transport distance of the carrier on the semiconductor layer. Since the resistivity of the semiconductor layer is higher than that of the conductive film layer, this can significantly reduce the transport loss of the carrier. On the other hand, it can accommodate etching the isolation trench entirely within the region covered by the insulating layer, which has relatively low alignment accuracy requirements, thus facilitating efficient mass production and thereby improving the battery yield and the conversion efficiency.

In some optional embodiments, the back-contact battery further includes metal electrodes, respectively arranged on the outer surface of the first semiconductor opening region and the outer surface of the second semiconductor opening region.

In some optional embodiments, the back-contact battery further includes a front passivation layer, arranged on the front surface of the silicon substrate.

More optionally, the front passivation layer is a silicon dielectric passivation layer. The silicon dielectric passivation layer can be a tunneling silicon oxide layer with a polysilicon layer or an intrinsic amorphous silicon layer with an N-type doped amorphous/microcrystalline silicon layer.

In some optional embodiments, the back-contact battery further includes a front anti-reflection layer, arranged on the outer surface of the front passivation layer.

More optionally, the front anti-reflection layer is a silicon dielectric anti-reflection layer. Those skilled in the art can use any conventional materials for the silicon dielectric anti-reflection layer known in the prior art, and thus, further details will not be elaborated here.

In a second aspect, the present disclosure provides a preparation method of a back-contact battery, wherein the back-contact battery is the back-contact battery described in the first aspect. The preparation method of a back-contact battery includes the following steps:

S101: providing a silicon substrate with a first semiconductor layer, a second semiconductor layer, and an insulating film sequentially arranged along the Z-axis direction on the back surface, wherein the first semiconductor layer is provided with second semiconductor opening regions arranged at intervals to accommodate a portion of the second semiconductor layer;

S102: applying, on the back surface obtained from S101, protective ink on a portion of the outer surface of the insulating film. The protective ink covers the outer surface of the portion of the insulating film that needs to be retained, and the size of the protective ink is set according to the insulating layer required to be formed;

S103: removing, on the back surface obtained from S102, the portion of the insulating film not covered by the protective ink, thereby forming the insulating layer from the portion of the insulating film that needs to be retained.

In S103, the portion of the insulating film not covered by protective ink is removed. The removal of the insulating film, for example, can be performed with an etching solution. The etching solution is, for example, an HF-containing solution, wherein the mass concentration of HF can be, for example, 1 wt %-10 wt %.

In some optional embodiments, S103 further includes: after removing the portions of the insulating film not covered by the protective ink, further removing the protective ink. In this solution, the type of protective ink can be, for example, hot melt wax or other resins that can be removed cleanly with an alkaline solution. The method for removing the protective ink can involve using hot water or a weak alkaline solution, as long as it can be completely removed.

In other optional embodiments, in S102, the protective ink serves as an insulating protective layer, and in S103, the protective ink is not removed.

In some optional embodiments, the preparation method also includes the following steps:
S104: depositing a conductive film layer on the back surface obtained from S103;
S105: opening an isolation trench on the conductive film layer of the back surface obtained in S104.

In S104, the method of depositing the conductive film layer can be achieved using physical vapor deposition technology (PVD) or reactive plasma deposition technology (RPD), for example.

More optionally, the method for opening the isolation trench can be laser etching, printing, or etching after inkjet printing of the protective ink. More optionally, the process is simplified by using the laser etching method.

In the optional solution of the present disclosure, the isolation trench is located on the outer surface of the insulating layer in the Z-axis direction. The insulating layer (or the insulating layer and the insulating protective layer) can serve as the mask layer for preparing the isolation trench. The isolation trench can be entirely on the polished region or the outer surface of the insulating protective layer, thus realizing openings on the polished region or on the insulating protective layer. The laser isolation method can be used without damaging the second semiconductor layer, simplifying the process and improving the reliability of the battery.

In some optional embodiments, S101 further includes forming a front passivation layer and a front anti-reflection layer on the front surface of the silicon substrate and forming the first semiconductor opening region on the second semiconductor layer.

More optionally, the preparation method further includes: S106, arranging metal electrodes respectively on the outer surface of the first semiconductor opening region and the outer surface of the second semiconductor opening region on the back surface obtained from S105.

The metal electrode can be formed by methods such as printing silver paste to form silver paste grid electrodes or electroplating to form copper grid electrodes.

In a third aspect, the present disclosure provides a photovoltaic module, including the back-contact battery described in the first aspect.

The following is a detailed description of the embodiments of the present disclosure, with examples shown in the drawings. Throughout the description, similar or identical reference numerals indicate corresponding or similar elements with the same or similar functions. The embodiments described below by reference to the drawings are exemplary and are only configured to explain the present disclosure and are not to be construed as a limitation of the present disclosure.

Example 1

A preparation method of a back-contact battery is as follows.

S101: as shown in FIG. 1, providing a first semiconductor layer, a second semiconductor layer, and an insulating film 6 (silicon nitride) that are formed on a back surface of a silicon substrate 1. The first semiconductor layer included a first passivation layer 2 (tunneling oxide layer, with thickness of 1.5 nm) and a first conductive semiconductor film layer 3 (N-type polycrystalline layer, with doping concentration of 8 e20 cm$^{-3}$, and thickness of 150 nm). The second semiconductor layer included a second passivation layer 4 (intrinsic amorphous silicon layer, with thickness of 10 nm) and a second conductive semiconductor film layer 5 (P-type doped amorphous silicon layer, with thickness of 20 nm, and doping concentration of 8 e19 cm$^{-3}$), where the front surface of the battery structure was formed with a front film layer 7. The front film layer 7 included a silicon dielectric passivation layer and a silicon dielectric anti-reflection layer. A second semiconductor opening region was arranged on the first conductive semiconductor film layer 3, where the width W2 of the second semiconductor opening area was 500 μm. The surface of the silicon substrate in the horizontal region 101 of the second semiconductor opening region was a polished surface. A first semiconductor opening region was arranged on the second semiconductor layer to expose the first semiconductor layer, where the length W4 of the first semiconductor opening region was 200 μm. The spacing Wg between the first semiconductor opening region and the second semiconductor opening region was 100 μm.

Figure 2:
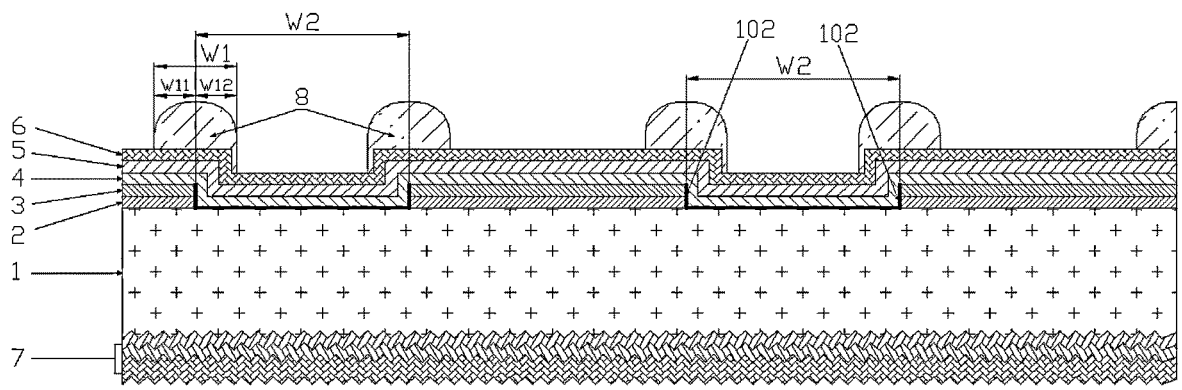
FIG. 2 is a schematic diagram of a structure of a silicon substrate formed with a protective ink on the back surface in Example 1 of the present disclosure.

S102: as shown in FIG. 2, inkjet printing of a protective ink 8 (hot melt wax) on the outer surface directly above the side-surface edge 102 of the second semiconductor opening region on the back surface of the silicon substrate 1. The protective ink 8 spanned the side-surface edge 102 of the second semiconductor opening region. The width W1 of the protective ink 8 was 100 μm, wherein the length W12 of the protective ink 8 spanning above the second semiconductor opening region was ≥10 μm and the span length W11 spanning the first semiconductor layer was ≥10 μm, with W12:W11=1:1. W12/W2 was 1:10 and W11/Wg was 1:2.

Figure 3:
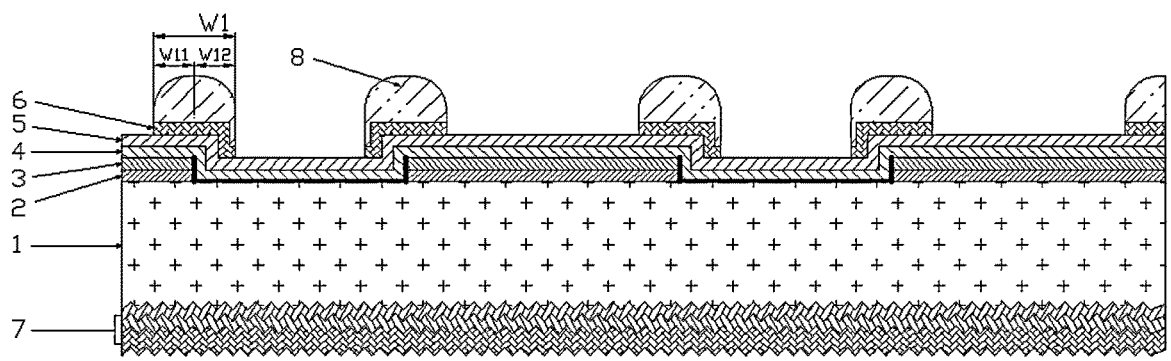
FIG. 3 is a schematic diagram of a structure after the insulating film outside the protective ink is etched off in Example 1 of the present disclosure.
Figure 4:
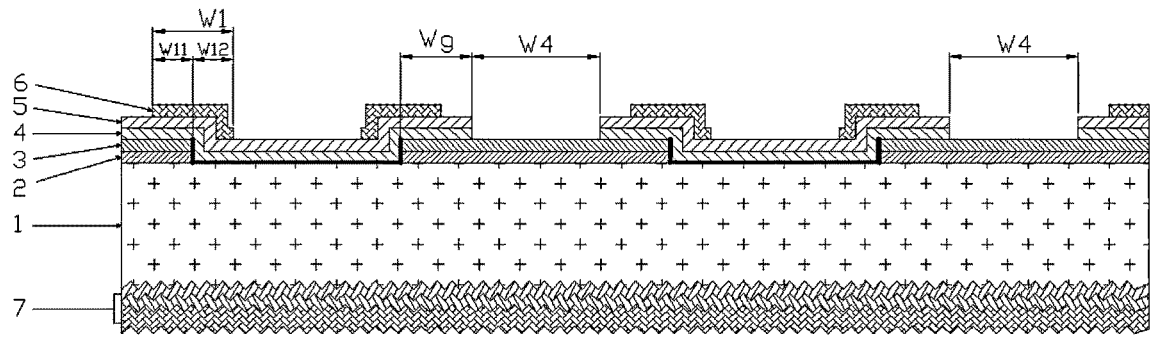
FIG. 4 is a schematic diagram of a structure after the protective ink is removed and cleaned in Example 1 of the present disclosure.

S103: As shown in FIG. 3, using a solution containing 5 wt % HF to etch off the insulating film 6 outside the protective ink 8, forming the insulating layer. As shown in FIG. 4, the protective ink 8 was removed and cleaned thoroughly with hot water.

Figure 5:
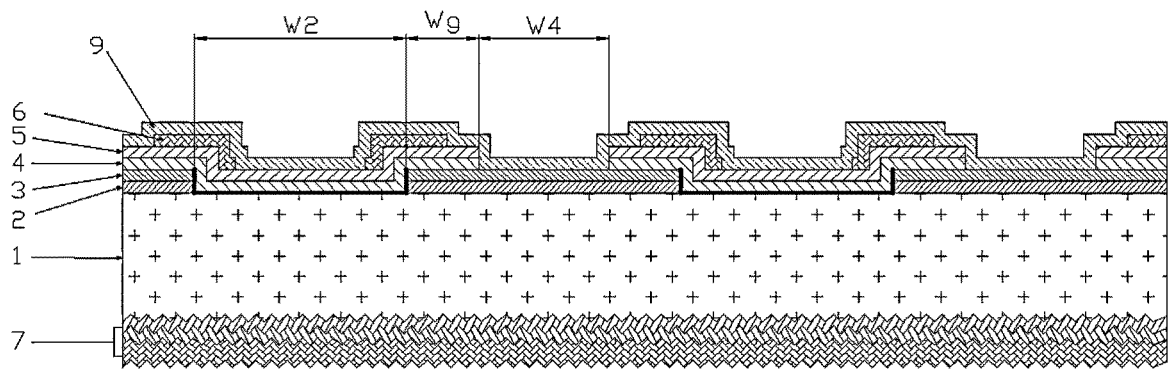
FIG. 5 is a schematic diagram of a structure with the conductive film layer deposited on the back surface in Example 1 of the present disclosure.

S104: as shown in FIG. 5, depositing a conductive film layer 9 on the back surface of the silicon substrate 1 using physical vapor deposition (PVD) technology, wherein the conductive film layer 9 is a transparent conductive film layer and the transparent conductive film layer is a tin-doped indium oxide-based thin film.

Figure 6:
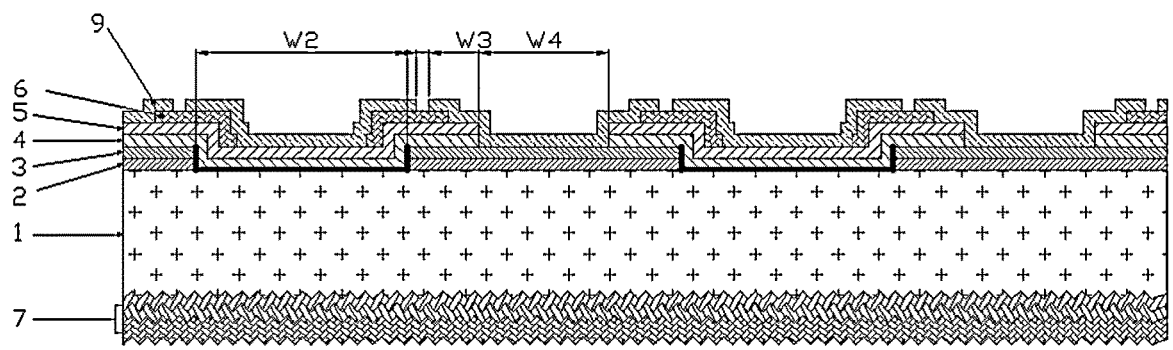
FIG. 6 is a schematic diagram of a structure with an isolation trench formed directly above the insulating film on the back surface in Example 1 of the present disclosure.

S105: as shown in FIG. 6, forming an isolation trench directly above the insulating film 6 on the back surface of the silicon substrate 1. The width W3 of the isolation trench was 50 μm, and the isolation trench was formed directly by laser etching. The ratio of W1 to the width of the isolation trench was 2:1.

Figure 7:
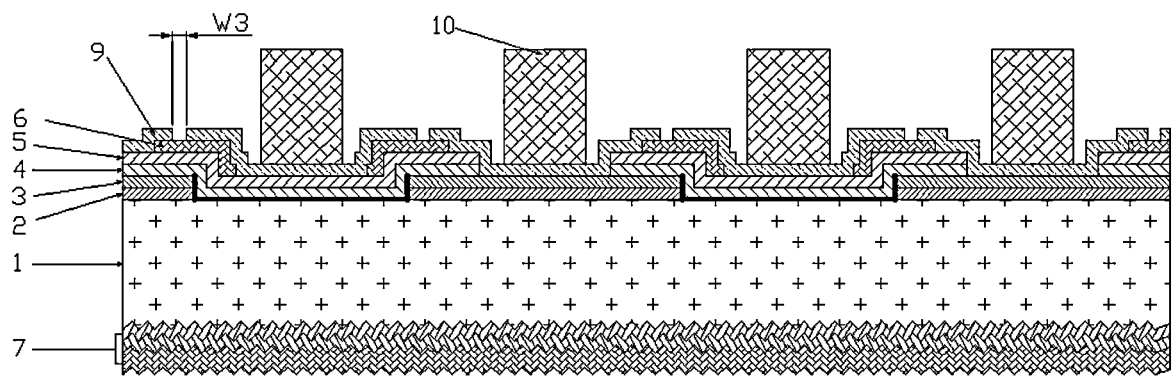
FIG. 7 is a schematic diagram of a structure with the metal electrodes formed on the back surface in Example 1 of the present disclosure.

S106: as shown in FIG. 7, forming metal electrodes 10 on the back surface of the silicon substrate 1.

The test results of the parallel resistance, battery yield, and conversion efficiency of the back-contact battery of the example are shown in Table 1 below.

Example 2

Proceeding with reference to the method of Example 1, the difference was that the two semiconductor layers had different P/N types. Specifically, the first conductive semiconductor film layer 3 was a P-type polysilicon layer, and the second conductive semiconductor film layer 5 was an N-type doped amorphous silicon layer. The corresponding tests were performed and the results are shown in Table 1.

Example 3

Proceeding with reference to the method of Example 1, the difference was that the protective ink 8 was an insulating ink and was not subsequently removed. The steps are specified below.

S102: printing the protective ink 8 as insulating ink (i.e., insulating protection layer), which is epoxy resin and cannot be removed by hot water or acid/base solutions. The thickness of the insulating ink was 10 μm.

S103: as shown in FIG. 3, etching off the insulating film 6 outside the insulating ink using a solution containing HF.

Figure 8:
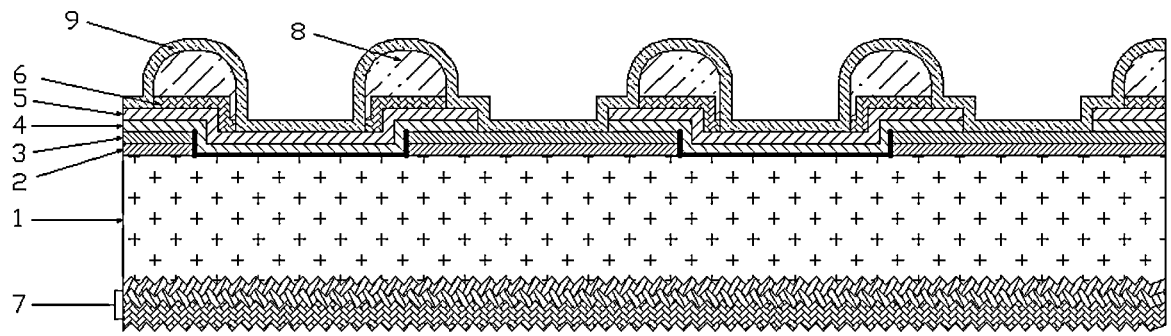
FIG. 8 is a schematic diagram of a structure with the conductive film layer deposited on the back surface in Example 3 of the present disclosure.

S104: as shown in FIG. 8, depositing the conductive film layer 9 on the back surface of the silicon substrate 1 using physical vapor deposition (PVD) technology.

Figure 9:
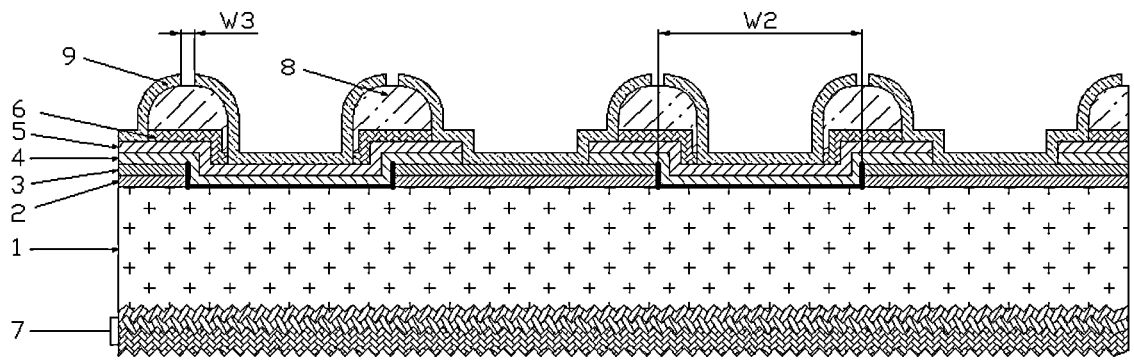
FIG. 9 is a schematic diagram of a structure with an isolation trench formed directly above the insulating ink on the back surface in Example 3 of the present disclosure.

S105: as shown in FIG. 9, forming an isolation trench directly above the insulating ink on the back surface of the silicon substrate 1.

Figure 10:
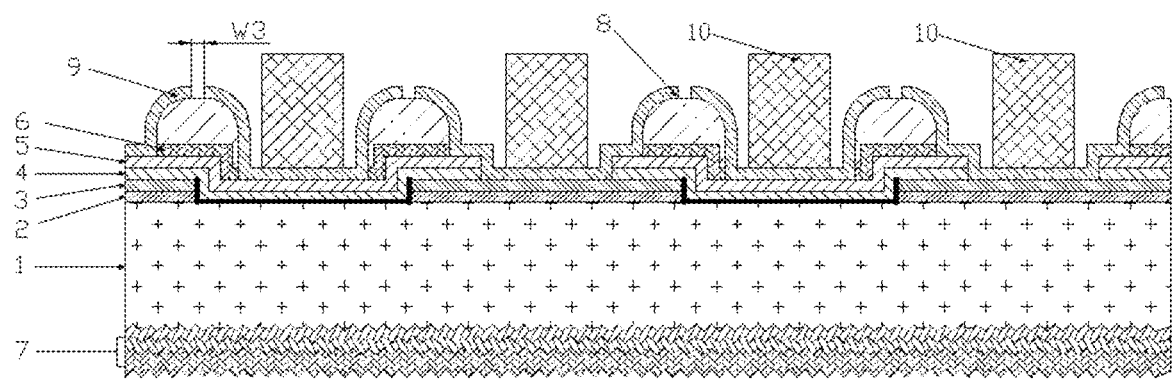
FIG. 10 is a schematic diagram of a structure with the metal electrodes formed on the back surface in Example 3 of the present disclosure.

S106: as shown in FIG. 10, forming metal electrodes 10 on the back surface of the silicon substrate 1.

The corresponding tests were performed and the results are shown in Table 1.

Example 4

Proceeding with reference to the method of Example 1, the difference was that W1 was 30 μm and W12:W11 was unchanged. At this point, the ratio of W1 to the width W3 of the isolation trench was adaptively calculated to be 0.6:1, W12/W2 to be 1:33, and W11/Wg to be 1:6.7.

The corresponding tests were performed and the results are shown in Table 1.

Example 5

Proceeding with reference to the method of Example 1, the difference was that W1 remained unchanged and W12:W11 was changed to 9:1. The adaptive calculation was W12/W2=1:5.6, and W11/Wg=1:10.

The corresponding tests were performed and the results are shown in Table 1.

Example 6

Proceeding with reference to the method of Example 1, the difference was that W1 remained unchanged and W12:W11 was changed to 0.1:1. The adaptive calculation was W12/W2=1:55, and W11/Wg=1:1.1.

The corresponding tests were performed and the results are shown in Table 1.

Example 7

Proceeding with reference to the method of Example 1, the difference was that the width of the isolation trench was changed, so that a ratio of a length W1 of the insulating layer in the X-axis direction to the width W3 of the isolation trench was 10:1.

The corresponding tests were performed and the results are shown in Table 1.

Example 8

Proceeding with reference to the method of Example 1, the difference was that a conventional heterojunction passivation structure was applied. Specifically, the first passivation layer was an intrinsic amorphous silicon layer with a thickness of 10 nm; the first conductive semiconductor layer was an N-type microcrystalline silicon layer with a thickness of 10 nm, and the doping concentration was the same as that in Example 1.

The corresponding tests were performed and the results are shown in Table 1.

Comparative Example 1

Figure 11:
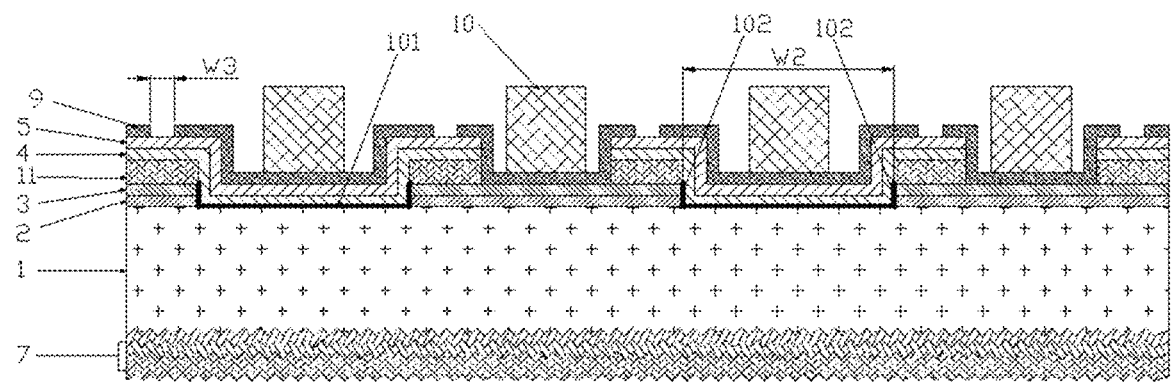
FIG. 11 is a schematic diagram of a structure of a battery in Comparative Example 1.

Proceeding with reference to the method of Example 1, the difference was that a combined passivation battery structure without an insulating film 6 was applied, as shown in FIG. 11. However, a mask layer 11 was further deposited within a spacing Wg between the first semiconductor opening region and the second semiconductor opening region, where the mask layer 11 was located between the first semiconductor layer and the second semiconductor layer. Moreover, an insulation trench was arranged above an outer surface of the mask layer 11 and away from the side-surface edge 102 of the second semiconductor opening region.

The corresponding tests were performed and the results are shown in Table 1.

Comparative Example 2

Proceeding with reference to the method of Example 1, the difference was that W1 remained unchanged and W12:W11 was changed to 20:1. The adaptive calculation was W12/W2=1:5.3, and W11/Wg=1:21.

The corresponding tests were performed and the results are shown in Table 1.

Comparative Example 3

Proceeding with reference to the method of Example 1, the difference was that W1 remained unchanged and W12:W11 was changed to 0.05:1. The adaptive calculation was W12/W2=1:105, and W11/Wg=1:1.1.

The corresponding tests were performed and the results are shown in Table 1.

Comparative Example 4

Proceeding with reference to the method of Example 8, the difference was that a conventional heterojunction passivation battery structure without an insulating film 6 was applied. However, a mask layer 11 was further deposited within a spacing Wg between the first semiconductor opening region and the second semiconductor opening region, where the mask layer 11 was located between the first semiconductor layer and the second semiconductor layer. Moreover, an insulation trench was arranged above an outer surface of the mask layer 11 and away from the side-surface edge 102 of the second semiconductor opening region.

The corresponding tests were performed and the results are shown in Table 1.

TABLE 1

| Example number | parallel resistance (Ω) | battery yield % | conversion efficiency of battery (%) |
|---|---|---|---|
| Example 1 | ≥2000 | 98.5 | 26.3 |
| Example 2 | ≥2000 | 98.5 | 26.1 |
| Example 3 | ≥2000 | 98.3 | 26.3 |
| Example 4 | ≥1000 | 97.5 | 26.2 |
| Example 5 | ≥1000 | 97.5 | 26.2 |
| Example 6 | ≥1000 | 97.5 | 26.2 |
| Example 7 | ≥1000 | 97 | 26.25 |
| Example 8 | ≥2000 | 97 | 26.1 |
| Comparative Example 1 | ≈30 | 96 | 26.05 |
| Comparative Example 2 | ≈200 | 96.5 | 26.2 |
| Comparative Example 3 | ≈200 | 96.5 | 26.2 |
| Comparative Example 4 | ≈30 | 96 | 25.85 |

Through the above examples and comparative examples, it is evident that the examples of the present disclosure can significantly improve leakage phenomena without the arrangement of a mask layer. Meanwhile, it balances passivation effects, increases the parallel resistance of the battery, and thereby enhances the conversion efficiency and the yield of the battery. However, conventional structures in Comparative Example 1, and Comparative Examples 2-4 that fall outside the scope of the present disclosure, fail to achieve the comprehensive effects in the present disclosure.

Optionally, as seen in Examples 1 and 2 of the present disclosure, the use of an N-type semiconductor layer for the first semiconductor layer and a P-type semiconductor layer for the second semiconductor layer is more conducive to enhancing the conversion efficiency of the battery. According to Examples 1 and 3 of the present disclosure, it is evident that removing the insulating ink on the surface of the insulating layer further enhances the production yield of the battery. According to Examples 1 and 4-7 of the present disclosure, it is evident that arranging an insulating layer with an appropriate width and an isolation trench with an appropriate width on both sides of the outer surface of the side-surface edge of the second semiconductor opening region is more conducive to improving the parallel resistance of the battery, thereby increasing both the yield and the conversion efficiency of the battery. According to Examples 1 and 8 of the present disclosure, it is evident that the use of a combined passivation structure is more conducive to improving the production yield of the battery and the conversion efficiency of the battery than conventional heterojunction structures.

Optional embodiments of the present disclosure are described in detail above. However, the present disclosure is not limited thereto. Within the scope of the technical concept of the present disclosure, various simple modifications can be made to the technical solutions of the present disclosure, including combining any technical features in any other suitable manner. These simple modifications and combinations should also be considered as part of the content disclosed in the present disclosure and fall within the scope of protection of the present disclosure.

INDUSTRIAL PRACTICALITY

In the present disclosure, by arranging the insulating layer on the outer surface of the second semiconductor layer and ensuring that in the X-axis direction, the insulating layer spans the side-surface edge of the second semiconductor opening region and extends at both ends in the aforementioned suitable proportions, the back-contact battery can significantly improve leakage phenomena and avoid short circuits without the need for arranging a mask layer. This increases the parallel resistance of the battery, thereby improving the conversion efficiency of the battery and the battery yield.

The invention claimed is:

1. A back-contact battery, comprising a silicon substrate with a front surface and a back surface; a first semiconductor layer with a second semiconductor opening region arranged on the back surface; and a second semiconductor layer arranged on an outer surface of the first semiconductor layer and within the second semiconductor opening region; and further comprising multiple insulating layers arranged at intervals along an X-axis direction of the back surface, wherein an insulating layer is arranged on an outer surface of the second semiconductor layer; and in the X-axis direction, the insulating layer spans a side-surface edge of the second semiconductor opening region with both ends extending, respectively; and the insulating layer has a span length W12 on the second semiconductor opening region, and the insulating layer has a span length W11 on the first semiconductor layer, satisfying a condition: W12:W11=0.1–10:1, wherein a length W1 of the insulating layer in the X-axis direction is 20-200 μm and W12≥10 μm.

2. The back-contact battery according to claim 1, wherein a material of the insulating layer comprises at least one of silicon nitride, silicon oxynitride, and silicon oxide.

3. The back-contact battery according to claim 1, wherein the back-contact battery further comprises a conductive film layer, arranged on an outer surface of the insulating layer and thereon arranged with an isolation trench; and the isolation trench is located on an outer surface of the insulating layer in a Z-axis direction.

4. The back-contact battery according to claim 3, wherein a width W3 of the isolation trench in the X-axis direction is 10-190 μm, and a ratio of a length W1 of the insulating layer in the X-axis direction to the width W3 of the isolation trench is 0.3-10:1; and/or, the isolation trench is located directly above the side-surface edge of the second semiconductor opening region.

5. The back-contact battery according to claim 3, wherein the back-contact battery further comprises an insulating protective layer covering the outer surface of the insulating layer; the insulating protective layer is located between the insulating layer and the conductive film layer, and the isolation trench is located on an outer surface of the insulating protective layer in the Z-axis direction, wherein a thickness of the insulating protective layer is 5-30 μm; and/or, a material of the insulating protective layer comprises at least one of an epoxy resin, an acrylic resin, and a polyurethane resin.

6. The back-contact battery according to claim 3, wherein the first semiconductor layer comprises a first passivation layer and a first conductive semiconductor film layer, and the first passivation layer is a tunneling oxide layer or an intrinsic silicon layer; the second semiconductor layer comprises a second passivation layer and a second conductive semiconductor film layer, wherein the second passivation layer is an intrinsic silicon layer; and for the first conductive semiconductor film layer and the second conductive semiconductor film layer, one is N-type, and the other is P-type.

7. The back-contact battery according to claim 6, wherein the first passivation layer is a tunneling oxide layer; the first conductive semiconductor film layer is a doped polysilicon layer; and the second conductive semiconductor film layer is a doped amorphous silicon or microcrystalline silicon layer.

8. The back-contact battery according to claim 7, wherein the first conductive semiconductor film layer is N-type, and the second conductive semiconductor film layer is P-type.

9. The back-contact battery according to claim 1, wherein a mask layer is not provided between the first semiconductor layer and the second semiconductor layer; and/or, the front surface of the silicon substrate is a textured surface, and the back surface of the silicon substrate is a polished surface; or, the second semiconductor opening region of the back surface is a textured surface and other regions of the back surface are polished regions.

10. The back-contact battery according to claim 3, wherein the second semiconductor layer is provided with first semiconductor opening regions arranged at intervals along the X-axis direction to expose the first semiconductor layer; the first semiconductor opening regions are located between two adjacent second semiconductor opening regions, and the first semiconductor opening regions accommodate a portion of the conductive film layer, wherein
   in the X-axis direction, a length W4 of the first semiconductor opening region is 100-300 μm, a length W2 of the second semiconductor opening region is 300-700 μm, and a spacing Wg between the first semiconductor opening region and the second semiconductor opening region is 50-400 μm;
   and/or, W12/W2 is 1:3-55, and W11/Wg is 1:1-10.

11. The back-contact battery according to claim 10, wherein the back-contact battery further comprises
   metal electrodes, respectively arranged on an outer surface of the first semiconductor opening region and an outer surface of the second semiconductor opening region;
   a front passivation layer, arranged on the front surface of the silicon substrate; and
   a front anti-reflection layer, arranged on an outer surface of the front passivation layer.

12. A preparation method of a back-contact battery, wherein the back-contact battery is the back-contact battery according to claim 1, and the preparation method of the back-contact battery comprises following steps:

S101, providing a silicon substrate with a first semiconductor layer, a second semiconductor layer, and an insulating film sequentially arranged along a Z-axis direction on a back surface, wherein the first semiconductor layer is provided with second semiconductor opening regions arranged at intervals to accommodate a portion of the second semiconductor layer;

S102, applying, on the back surface obtained from the S101, protective ink on a portion of an outer surface of the insulating film, wherein the protective ink covers the outer surface of the portion of the insulating film that needs to be retained, and a size of the protective ink is set according to an insulating layer required to be formed; and S103, removing, on the back surface obtained from the S102, portions of the insulating film not covered by the protective ink, thereby forming the insulating layer from the portion of the insulating film that needs to be retained.

13. The preparation method according to claim 12, wherein the S103 further comprises: after removing the portions of the insulating film not covered by the protective ink, further removing the protective ink;
   or, in the S102, the protective ink serves as an insulating protective layer, and in the S103, the protective ink is not removed.

14. The preparation method according to claim 12, wherein the preparation method further comprises
   S104, depositing a conductive film layer on the back surface obtained from the S103;
   S105, opening an isolation trench on the conductive film layer of the back surface obtained in the S104, wherein a method for opening the isolation trench comprises laser etching, printing, or etching after inkjet printing of the protective ink;
   and/or, the S101 further comprises forming a front passivation layer and a front anti-reflection layer on the front surface of the silicon substrate and forming a first semiconductor opening region on the second semiconductor layer, and the preparation method further comprises S106, arranging metal electrodes respectively on an outer surface of the first semiconductor opening region and the outer surface of the second semiconductor opening region on the back surface obtained from the S105.

15. A photovoltaic module, comprising the back-contact battery according to claim 1.

* * * * *